United States Patent
Koyama

(10) Patent No.: US 9,947,706 B2
(45) Date of Patent: Apr. 17, 2018

(54) SEMICONDUCTOR DEVICE HAVING A LIGHT RECEIVING ELEMENT

(71) Applicant: SII Semiconductor Corporation, Chiba-shi, Chiba (JP)

(72) Inventor: Takeshi Koyama, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/446,229

(22) Filed: Mar. 1, 2017

(65) Prior Publication Data

US 2017/0256579 A1    Sep. 7, 2017

(30) Foreign Application Priority Data

Mar. 3, 2016  (JP) ................. 2016-041127

(51) Int. Cl.
*H01L 27/146*  (2006.01)

(52) U.S. Cl.
CPC .... *H01L 27/14623* (2013.01); *H01L 27/1463* (2013.01); *H01L 27/14643* (2013.01)

(58) Field of Classification Search
CPC ..... H01L 2924/12036; H01L 29/66136; H01L 51/5253; H01L 51/5256; H01L 51/5259; H01L 27/14689; H01L 27/1463; H01L 2924/12043; H01L 24/75; H01L 24/94; H01L 51/5265; H01L 51/5268; H01L 51/5271; H01L 51/5284; H01L 24/19; H01L 24/20; H01L 24/23; H01L 24/26; H01L 24/73; H01L 24/74; H01L 24/741; H01L 25/0657; H01L 25/117; H01L 24/03; H01L 24/04; H01L 24/05; H01L 24/10; H01L 24/18; H01L 25/043; H01L 25/11; H01L 27/00; H01L 25/065; H01L 25/0652; H01L 25/0655

See application file for complete search history.

(56) References Cited

U.S. PATENT DOCUMENTS

2007/0012970 A1 *  1/2007  Mouli ............... H01L 27/14603
                                                                          257/292

FOREIGN PATENT DOCUMENTS

JP    2010-045280 A    2/2010

* cited by examiner

*Primary Examiner* — Sonya D McCall Shepard
(74) *Attorney, Agent, or Firm* — Brinks Gilson & Lione

(57) ABSTRACT

Provided is a semiconductor device having a light receiving element in which a plurality of photodiodes are formed on a top surface of a P-type semiconductor substrate, an insulating oxide film is formed on surfaces of the photodiodes 51 via a buried oxide film, and an SOI layer of single crystal silicon is formed between a photodiode and an adjacent photodiode via the buried oxide film for shielding unnecessary light.

4 Claims, 7 Drawing Sheets

SEMICONDUCTOR DEVICE HAVING A LIGHT RECEIVING ELEMENT

RELATED APPLICATIONS

This application claims priority under 35 U.S.C. § 119 to Japanese Patent Application No. 2016-041127 filed on Mar. 3, 2016, the entire content of which is hereby incorporated by reference.

BACKGROUND OF THE INVENTION

1. Field of the Invention

The present invention relates to a semiconductor device having a light receiving element.

2. Description of the Related Art

A CMOS image sensor is a semiconductor device, and includes in general, as a light receiving element, a pixel array of one-dimensionally or two-dimensionally arranged light receiving elements in a light receiving portion. Each pixel of the pixel array in the light receiving portion includes a photodetector formed from a photodiode having a PN junction. In each pixel, incident light is absorbed in a semiconductor substrate to generate carriers, and the generated carriers recombine in a depletion layer portion of the photodiode, making a voltage or a current which is obtained as an output. At this time, the incident light is reflected by an upper layer film of the PN junction to cause interference, and hence output fluctuations may occur depending on fluctuations in thickness of the upper layer film, causing a practical problem. Crosstalk due to oblique incidence of the light is also a problem. Further, the carriers generated at places other than a desired PN junction may become a source of a dark current.

As a solution of those problems, there is proposed a method involving shielding light at regions other than a light receiving element region with a metal wiring layer, to thereby suppress the light interference and the generation of the dark current (for example, see Japanese Patent Application Laid-open No. 2010-45280).

However, the light cannot be completely shielded in the portions where the wirings are led out for electrical connection between an internal circuit and a sensor portion. In addition, a void may be formed due to stress migration by the upper layer film when a light-shielding metal width is large, and a short circuit may occur due to hillocks when the interval between the metal wirings is small.

SUMMARY OF THE INVENTION

It is therefore an object of the present invention to provide a semiconductor device including a light receiving element, which may shield unnecessary light without the use of metal wirings.

In order to achieve the above-mentioned object, a photodetection semiconductor device according to one embodiment of the present invention includes a light receiving portion configured as follows.

In the semiconductor device having a light receiving element, which includes photodiodes each having a PN junction formed between a first conductivity type semiconductor substrate and a second conductivity type layer region formed on an upper surface of the first conductivity type semiconductor substrate, an oxide film is formed on the photodiodes, and an SOI layer, which is formed of single crystal silicon, is arranged between a photodiode and an adjacent photodiode via a buried oxide film for light shielding.

By taking a measure as described above, the light is shielded in regions other than the light receiving element region by the SOI layer. As a result, reflection, interference, and oblique incidence of light, and generation of a dark current may be suppressed. Further, a degree of freedom in wiring layout may be obtained because the wirings for shielding light are not used.

DETAILED DESCRIPTION OF THE PREFERRED EMBODIMENTS

Embodiments of the present invention are described below with reference to the drawings.

[First Embodiment]

Figure 1:
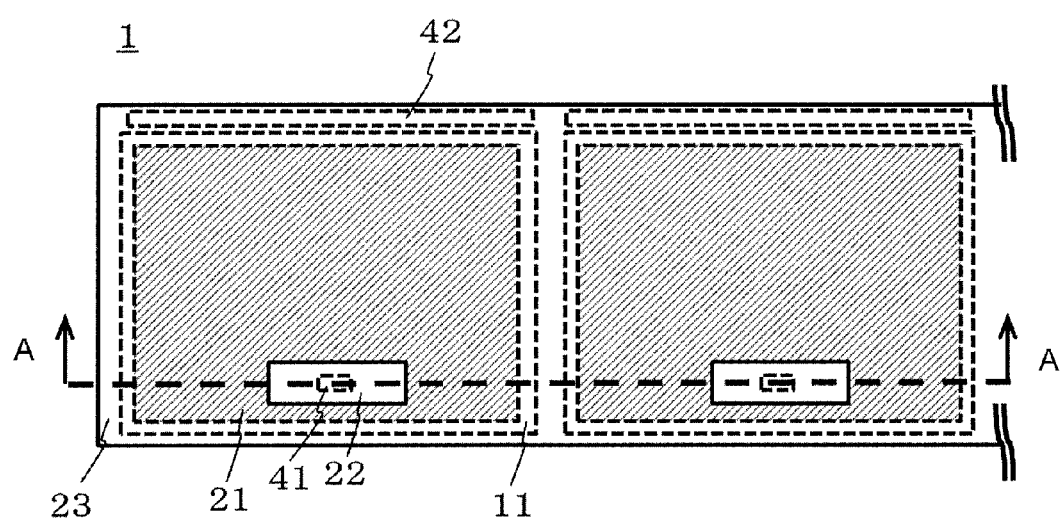
FIG. 1 is a plan view of a semiconductor device including a light receiving element of the present invention.

FIG. 1 is a plan view of a semiconductor device including a light receiving element according to the first embodiment of the present invention. A P-type layer region, which is a part of a P-type semiconductor substrate 11 is formed around N-type layer region 21, and a high concentration P-type semiconductor region 23 having a high P-type impurity concentration is formed around the P-type layer region. An anode electrode 42 is arranged in a region, which is a part of the high concentration P-type semiconductor region 23. A high concentration N-type semiconductor region 22 having a high N-type impurity concentration is formed in the N-type layer region 21, and a cathode electrode 41 is arranged in a region, which is a part of the high concentration N-type semiconductor region 22.

Further, as described below, in a region between adjacent N-type layer regions 21, an SOI layer 13 is formed to shield light via an oxide film 12 as to cover at least the P-type layer region formed from the P-type semiconductor substrate 11 and the high concentration P-type semiconductor region 23 having a high P-type impurity concentration.

Figure 2:
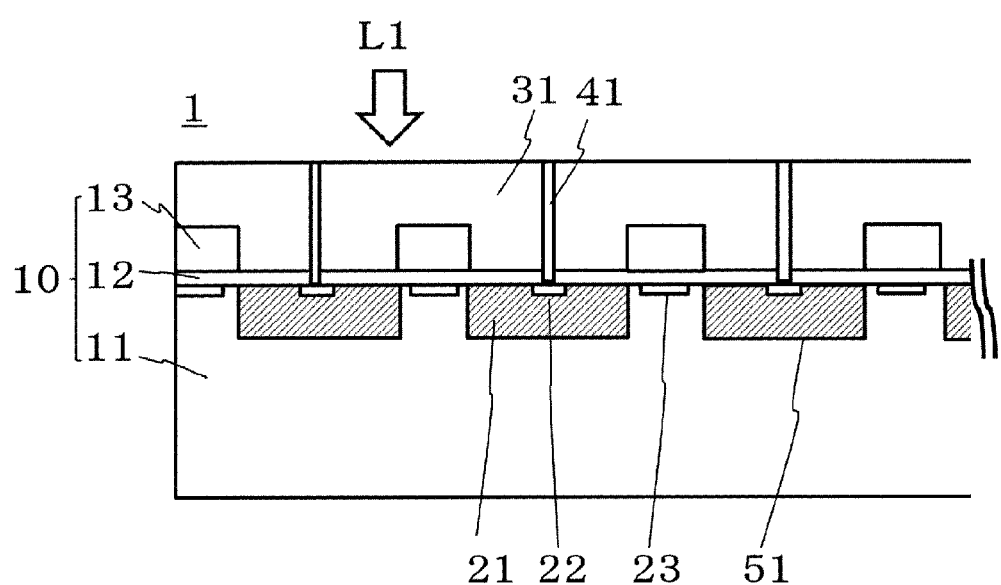
FIG. 2 is a cross-sectional view of a semiconductor device including a light receiving element according to a first embodiment of the present invention, taken along the line A-A of FIG. 1.

FIG. 2 is a cross sectional view of the semiconductor device including the light receiving element according to the first embodiment of the present invention, and is a cross-sectional view taken along the line A-A of FIG. 1. A plurality of the N-type layer regions 21 are separately formed, each to a predetermined depth from a surface of the semiconductor substrate 11. The high concentration N-type semiconductor regions 22 having a high N-type impurity concentration is formed on a top surface of each of the N-type layer regions 21 to which the cathode electrodes 41 is connected via the high concentration N-type semiconductor region 22. A P-type layer region, which is a part of the P-type semiconductor substrate 11, is arranged between the adjacent N-type layer regions 21, and on a top surface of the P-type layer region, the high concentration P-type semiconductor regions 23 having a high P-type impurity concentration is formed. Although not shown in this cross-sectional view, each of the anode electrodes 42 is connected to each of the P-type layer regions via the corresponding high concentration P-type semiconductor region 23.

A photodiode 51 is formed from a PN junction between the N-type layer region 21 and the semiconductor substrate 11. By applying a bias to the photodiode 51 such that a potential of the cathode electrode 41 becomes higher than that of the anode electrode 42, a depletion layer spreads in the semiconductor substrate 11, and the photodiode 51 operates as a light sensing region for capturing charges generated by light.

A buried oxide film 12 is formed on the semiconductor substrate 11, the N-type layer regions 21, the high concentration N-type semiconductor regions 22, and the high concentration P-type semiconductor regions 23. Further, the SOI layer 13 containing single crystal silicon is formed between the plurality of separate N-type layer regions 21 via the buried oxide film 12 containing silicon dioxide. An insulating oxide film 31 is formed on the SOI layer 13 and the buried oxide film 12, which has openings and is exposed, and each of the cathode electrodes 41 and each of the anode electrodes 42 described above are arranged in each of contact holes that are opened through the insulating oxide film 31.

The SOI layer 13 may be a single crystal silicon layer that is separated from the semiconductor substrate 11 which is also a supporting substrate of the SOI layer 13 by the buried oxide film 12, or may be a single crystal silicon layer that is bonded together with the semiconductor substrate 11 through the buried oxide film 12.

In FIG. 2, wirings of an upper layer or the like are omitted, but there is a high degree of freedom in wiring layout because there are no wirings used for shielding light.

The thickness of the SOI layer 13 is not particularly limited. However, when the SOI layer 13 does not have a thickness, that is, a height to some extent in regard to an opening width of the SOI layer 13, the SOI layer 13 cannot efficiently absorb oblique incident light, which results in insufficient suppression of crosstalk. According to results of measurements that have been performed, it is desired that an inequality "SOI layer thickness >(opening width of SOI layer*1.73)" holds. This thickness enables the SOI layer 13 to absorb oblique incident light having an elevation angle smaller than 60 degrees. A relationship between the thickness of the SOI layer 13 and a wavelength range of light to be absorbed, which is described later, also needs to be taken into consideration. When the thickness of the SOI layer 13 exceeds 1 μm, for example, it is not preferred to use a polycrystalline silicon film instead of the SOI layer 13 in terms of stress. This is because, in general, the polycrystalline silicon film is formed through CVD, and stress of the formed film becomes higher as the thickness thereof becomes larger.

When light L1 enters the semiconductor device 1 including the light receiving element having this structure, the light L1 is transmitted through the insulating oxide film 31 and the buried oxide film 12 such that each wavelength component of the irradiated light Li reaches the semiconductor substrate 11 depending on optical energy, to thereby generate carriers. The carriers are then diffused, and output as a voltage or a current when reaching the depletion layer region of the PN junction.

Light absorption of the irradiated light L1 by silicon (Si) follows the Lambert's law as below.

$$\text{Log}_{10}(J1/J0) = -\alpha L$$

Figure 3:
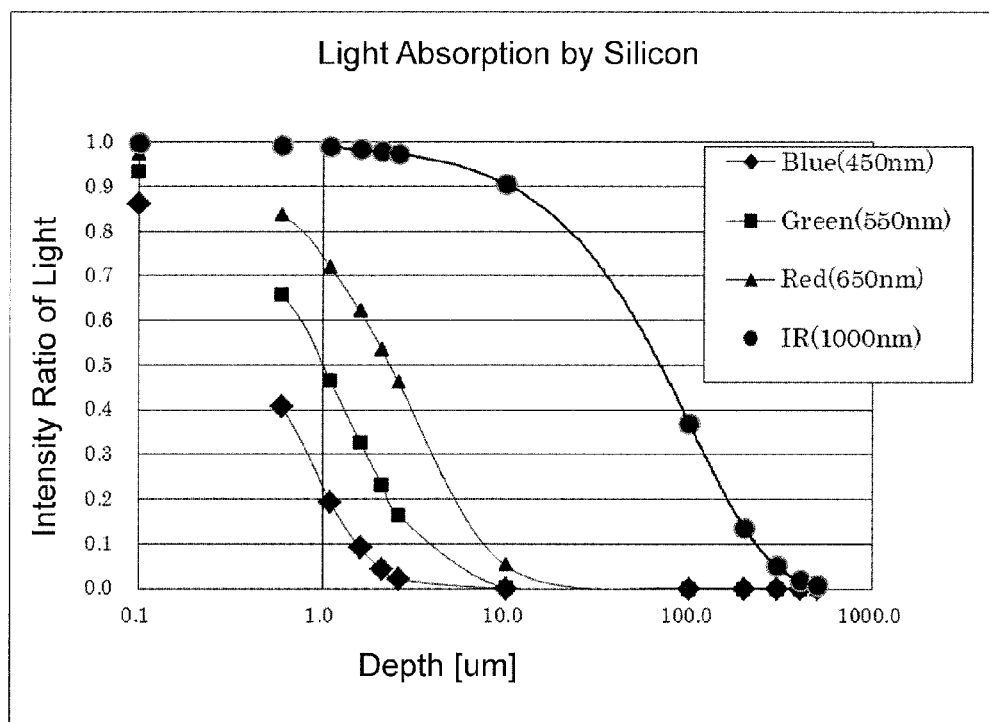
FIG. 3 is a graph for showing light absorption by a Si for each wavelength.

J0: an intensity of light before entering a medium
J1: an intensity of the light when the light has traveled through the medium
L: a reaching depth of the light
α: an absorbing coefficient FIG. 3 is a graph for showing light absorption by the silicon (Si) for each wavelength. The vertical axis represents an intensity ratio of a reaching light to the incident light. The horizontal axis represents the reaching depth of the light, and light having a shorter wavelength is more liable to be absorbed and attenuated in the silicon. In regions in which the SOI layer 13 is arranged, the incident light L1 is absorbed in the SOI layer 13 and does not reach the semiconductor substrate 11. That is, the SOI layer 13 having a certain amount of thickness functions to shield light. In this case, there is no need to take the reflection at the upper layer film into consideration, and the carriers that are a source of a dark current are not generated.

The thickness of the SOI layer 13 may be adjusted depending on light having a desired wavelength. For example, the thickness of the SOI layer 13 is set to from 0.05 μm to 1 μm when only ultraviolet light is shielded, set to from 10 μm to 100 μm when light having a shorter wavelength than that of visible light is shielded, and set to from 100 μm to 1,000 μm when infrared light is shielded.

In manufacturing of the semiconductor device including the light receiving element of the present invention, an SOI substrate having the SOI layer 13 formed above the P-type semiconductor substrate 11 via the buried oxide film 12 is prepared, and each of the photodiodes 51 is formed in each of opening portions, which are formed by removing the SOI layer 13 through etching. In the removal of the SOI layer 13 through etching, the buried oxide film 12 serves as an etching stopper which enables an easy detection of an endpoint.

[Second Embodiment]

Figure 4:
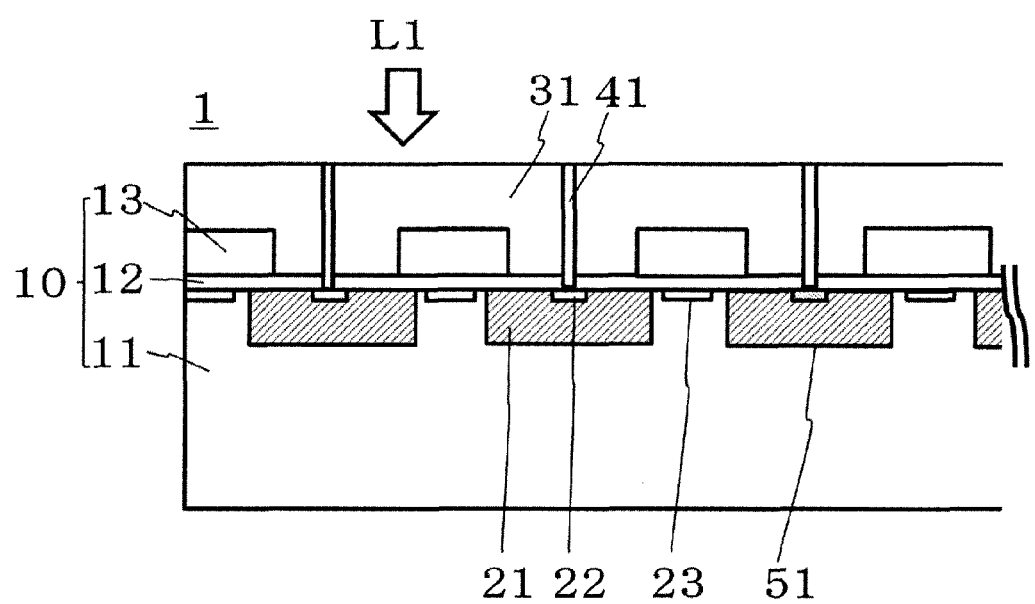
FIG. 4 is a cross-sectional view of a semiconductor device including a light receiving element according to a second embodiment of the present invention, for illustrating a portion corresponding to the cross section taken along the line A-A of FIG. 1.

FIG. 4 is a view for illustrating a cross section of a semiconductor device including a light receiving element according to a second embodiment of the present invention, and is a cross-sectional view corresponding to the cross section taken along the line A-A of FIG. 1. Portions corresponding to those in FIG. 2 are denoted with the same numerals. The second embodiment is different from the first embodiment illustrated in FIG. 2 in that each of opening regions of the SOI layer 13 is narrower than each of regions of the photodiodes 51 such that an influence of oblique incidence of light is eliminated. That is, the second embodiment has a structure in which end portions of each of the N-type layer regions 21 are covered with the SOI layer 13 such that the end portions of each of the N-type layer regions 21 and the SOI layer 13 overlap with each other.

[Third Embodiment]

Figure 5:
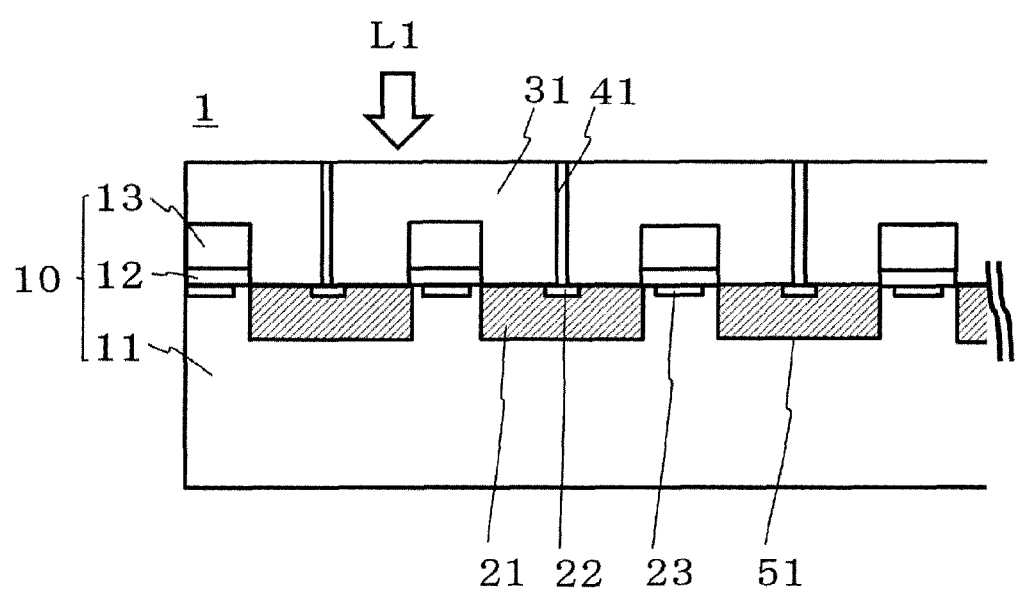
FIG. 5 is a cross-sectional view of a semiconductor device including a light receiving element according to a third embodiment of the present invention, for illustrating a portion corresponding to the cross section taken along the line A-A of FIG. 1.

FIG. 5 is a view for illustrating a cross section of a semiconductor device including a light receiving element according to a third embodiment of the present invention, and is a cross-sectional view corresponding to the cross section taken along the line A-A of FIG. 1. Portions corresponding to those in FIG. 2 are denoted with the same numerals. The third embodiment is different from the first embodiment illustrated in FIG. 2 in that the buried oxide film 12 is etched so as to have the same opening region as the SOI layer 13. As a result, the insulating oxide film 31 is directly formed on the N-type layer regions 21. This structure is effective in eliminating an influence of reflection of light at an interface between the buried oxide film 12 and the insulating oxide film 31, on output.

The thickness of the SOI layer 13 is not particularly limited. However, when the SOI layer 13 does not have a height to some extent in regard to the opening width of the SOI layer 13, insufficient percentage of the oblique incident light is absorbed, which results in insufficient suppression of crosstalk. According to results of measurements that have been performed, it is desired that (the SOI layer thickness+the buried oxide film thickness)>(the opening width of the SOI layer*1.73) be satisfied. In this case, the opening width of the SOI layer 13 equals an open width of the buried oxide film 12 due to the structure.

[Fourth Embodiment]

Figure 6:
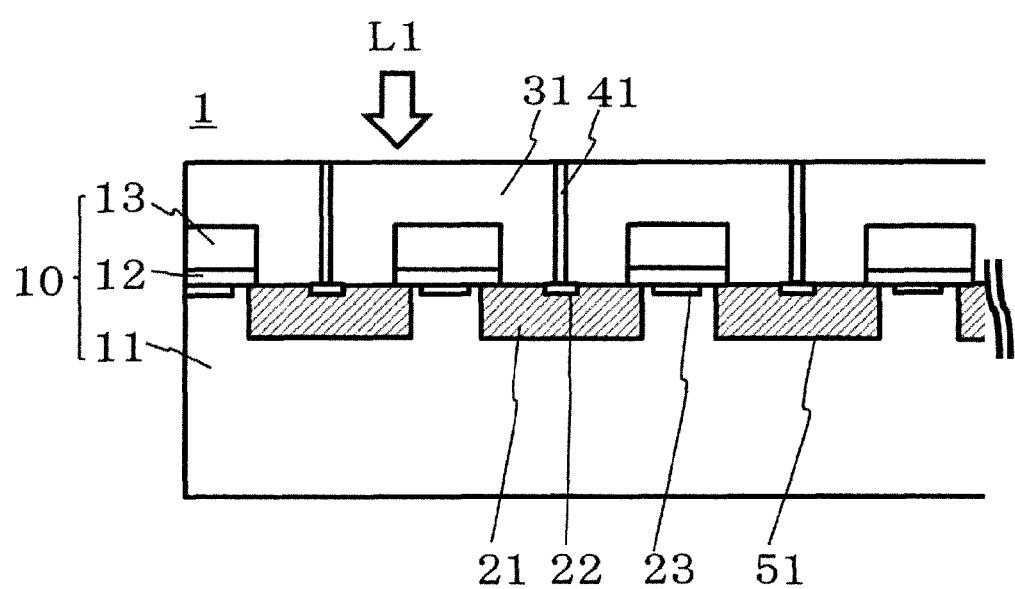
FIG. 6 is a cross-sectional view of a semiconductor device including a light receiving element according to a fourth embodiment of the present invention, for illustrating a portion corresponding to the cross section taken along the line A-A of FIG. 1.

FIG. 6 is a view for illustrating a cross section of a semiconductor device including a light receiving element according to a fourth embodiment of the present invention, and is a cross-sectional view corresponding to the cross section taken along the line A-A of FIG. 1. Portions corresponding to those in FIG. 2 are denoted with the same numerals. The fourth embodiment is different from the first embodiment illustrated in FIG. 2 in that the buried oxide film 12 is etched so as to have the same opening regions as the SOI layer 13, and each of the opening regions of the SOI layer 13 is narrower than each of regions of the photodiodes 51. This is performed in order to eliminate the influence of the oblique incidence of light, and the influence of the reflection of the light at the interface between the buried oxide film 12 and the insulating oxide film 31, on output.

[Fifth Embodiment]

Figure 7:
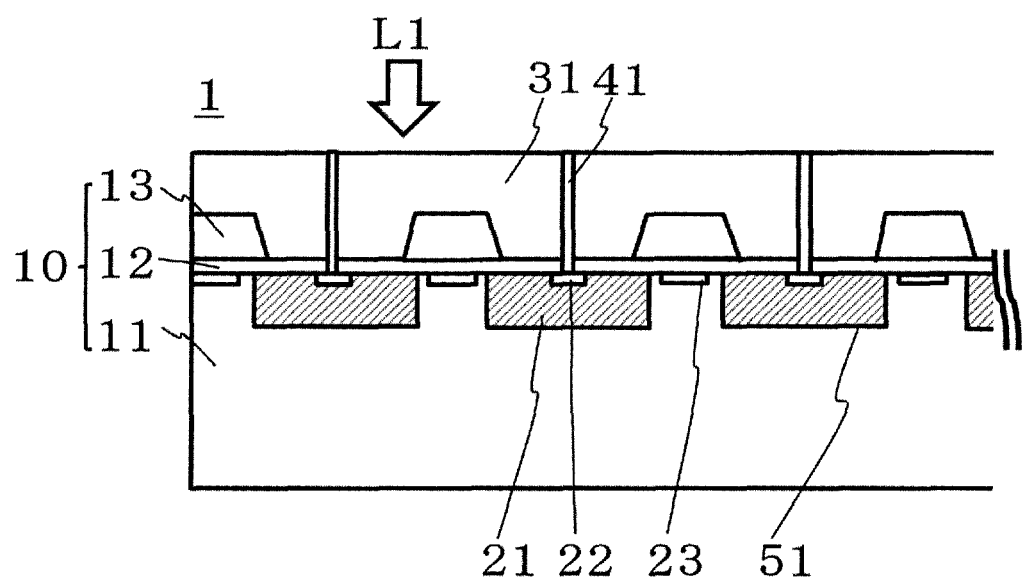
FIG. 7 is a cross-sectional view of a semiconductor device including a light receiving element according to a fifth embodiment of the present invention, for illustrating a portion corresponding to the cross section taken along the line A-A of FIG. 1.

FIG. 7 is a view for illustrating a cross section of a semiconductor device including a light receiving element according to a fifth embodiment of the present invention, and is a cross-sectional view corresponding to the cross section taken along the line A-A of FIG. 1. Portions corresponding to those in FIG. 2 are denoted with the same numerals. The fifth embodiment is different from the first embodiment illustrated in FIG. 2 in that the cross section of the SOI layer 13 has a trapezoidal shape in order to eliminate the influence of the oblique incidence of light. This structure may be achieved by reducing the degree of anisotropic intensity in a condition setting for the etching of the SOI layer 13. The structure may also be achieved by combining the etching with anisotropic etching, or by only using the anisotropic etching.

The thickness of the SOI layer 13 is not particularly limited. However, when the SOI layer 13 does not have a thickness, that is, a height to some extent in regard to the opening width of the SOI layer 13, insufficient percentage of the oblique incident light is absorbed, which results in insufficient suppression of crosstalk. According to results of measurements that have been performed, it is desired that the SOI layer thickness>(the opening width of the SOI layer*1.73) be satisfied.

What is claimed is:

1. A semiconductor device comprising a light receiving element,
   the light receiving element comprising:
   a plurality of photodiodes each having a PN junction between a first conductivity type semiconductor substrate and a second conductivity type layer region on an upper surface of the first conductivity type semiconductor substrate,
   the semiconductor device comprising:
   an SOI layer comprising single crystal silicon between a photodiode and an adjacent photodiode among the plurality of photodiodes and above the first conductivity type semiconductor substrate and separated therefrom by a buried oxide film; and
   an oxide film on the plurality of photodiodes and the SOI layer,
   wherein the SOI layer has a thickness sufficient to absorb light of a predetermined wavelength and having a particular reaching depth in the semiconductor substrate.

2. The semiconductor device comprising a light receiving element according to claim 1, wherein the SOI layer and the plurality of photodiodes overlap with each other in planar view.

3. The semiconductor device comprising a light receiving element according to claim 1, wherein the oxide film comprises the buried oxide film and an insulating oxide film on the buried oxide film.

4. The semiconductor device comprising a light receiving element according to claim 1, wherein the oxide film comprises an insulating oxide film.

* * * * *